（12） United States Patent
Hsu et al.

(10) Patent No.: US 9,368,570 B2
(45) Date of Patent: Jun. 14, 2016

(54) INTEGRATED CIRCUIT OF DRIVING DEVICE WITH DIFFERENT OPERATING VOLTAGES

(71) Applicant: NOVATEK Microelectronics Corp., Hsin-Chu (TW)

(72) Inventors: Yu-Hao Hsu, Hsinchu County (TW); Jui-Chang Lin, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/494,613

(22) Filed: Sep. 24, 2014

(65) Prior Publication Data
US 2016/0005812 A1    Jan. 7, 2016

(30) Foreign Application Priority Data
Jul. 1, 2014    (TW) .............................. 103122721 A

(51) Int. Cl.
*H01L 21/76*    (2006.01)
*H01L 29/06*    (2006.01)
*H01L 21/762*    (2006.01)

(52) U.S. Cl.
CPC ...... *H01L 29/0649* (2013.01); *H01L 21/76229* (2013.01)

(58) Field of Classification Search
CPC .................... H01L 29/0649; H01L 21/76229

USPC .......................................................... 438/435
See application file for complete search history.

(56) References Cited

U.S. PATENT DOCUMENTS

| 8,652,931 | B1 | 2/2014 | Luo | |
|---|---|---|---|---|
| 2007/0054464 | A1 | 3/2007 | Zhang | |
| 2009/0020800 | A1* | 1/2009 | Tempel | H01L 21/28273 257/316 |
| 2012/0104540 | A1* | 5/2012 | Mehrotra | H01L 21/3086 257/506 |
| 2012/0104564 | A1* | 5/2012 | Won | H01L 21/308 257/622 |
| 2013/0043513 | A1* | 2/2013 | Huang | H01L 21/76232 257/288 |
| 2014/0015047 | A1* | 1/2014 | Ng | H01L 21/82385 257/334 |
| 2015/0236085 | A1* | 8/2015 | Dong | H01L 29/063 257/330 |

* cited by examiner

*Primary Examiner* — Caleb Henry
(74) *Attorney, Agent, or Firm* — Winston Hsu; Scott Margo

(57) ABSTRACT

An integrated circuit for a driving device is disclosed. The integrate circuit includes a substrate comprising a high-voltage area and a low-voltage area; a plurality of first trenches, formed in the high-voltage area; a plurality of first isolations, formed in the plurality of first trenches of the high-voltage area; a plurality of second trenches, formed in the low-voltage area; and a plurality of second isolations, formed in the plurality of second trenches of the low-voltage area; wherein a depth difference exists between each of the plurality of first trenches and each of the plurality of second trenches.

5 Claims, 15 Drawing Sheets

INTEGRATED CIRCUIT OF DRIVING DEVICE WITH DIFFERENT OPERATING VOLTAGES

BACKGROUND OF THE INVENTION

1. Field of the Invention

The present invention relates to an integrated circuit and manufacturing method thereof, and more particularly, to an integrated circuit for a driving device in the display system and manufacturing method thereof.

2. Description of the Prior Art

The integrated circuit (IC), also called the mother of information technology (IT) industry, is the most basic and the most important components in the IT products. The IC is realized by configuring circuit components such as transistors, diodes, resistors and capacitors on a silicon chip, to form a complete logic circuit, so as to achieve functions of controlling, calculating and memorizing and to handle various affairs for people.

According to different applications, the integrated circuits may comprise circuit components operating in different voltage ranges (e.g. a high-voltage range and a low-voltage range). As process advances, the maximum voltage of the high-voltage range constantly increases and the maximum voltage of the low-voltage range constantly decreases. However, the effect of isolating electron transmission between electronic components is affected by the voltage range. When the maximum voltage of the high-voltage range constantly increases and/or the maximum voltage of the low-voltage range constantly decreases, the minimum size and the process design rules of the circuit components cannot be improved with the process advances. Thus, how to enhance the effect of isolating the electron transmission between the circuit components becomes a topic to be discussed.

SUMMARY OF THE INVENTION

In order to solve the above problem, the present invention provides an integrated circuit with isolations having different depths and manufacturing method thereof.

The present invention discloses an integrated circuit for a driving device, the integrate circuit comprising a substrate comprising a high-voltage area and a low-voltage area; a plurality of first trenches, formed in the high-voltage area; a plurality of first isolations, formed in the plurality of first trenches of the high-voltage area; a plurality of second trenches, formed in the low-voltage area; and a plurality of second isolations, formed in the plurality of second trenches of the low-voltage area; wherein a depth difference exists between each of the plurality of first trenches and each of the plurality of second trenches.

The present invention further discloses a method of manufacturing an integrated circuit of a driving device, the method comprising forming a shielding layer and a first photo resistor layer on a substrate from bottom to top; forming an opening pattern on the first photo resistor layer via a first mask; performing a first etching process, to etch the shielding layer; removing the first photo resistor layer; performing a second etching process, to from a plurality of first trenches at a high-voltage area of the substrate and from a plurality of second trenches at a low-voltage area of the substrate; forming a second photo resistor layer on the substrate; removing the second photo resistor layer covered on the high-voltage area via a second mask; performing a third etching process, to etch the plurality of first trenches; removing the second photo resistor layer; filling an isolation material on the substrate, to form an isolation layer; performing a planarization process, to make a height of the isolation layer to be equal to a height of the shielding layer; performing a fourth etching process, to form a plurality of first isolations at the plurality of first trenches of the high-voltage area and to form a plurality of second isolations at the plurality of second trenches of the low-voltage area; and performing a fifth etching process, to remove the shielding layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
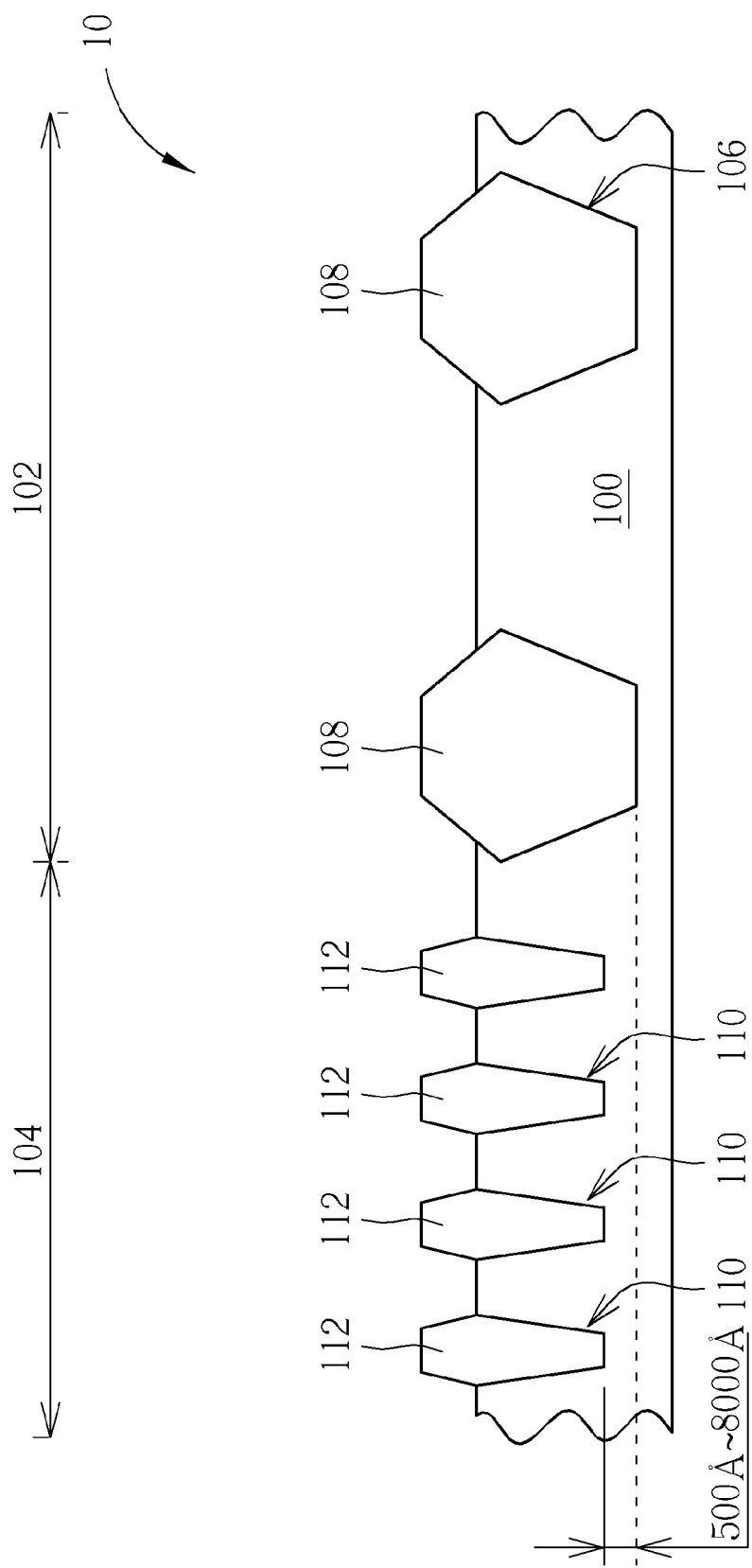
FIG. 1 is a cross-section view of an integrated circuit according to an embodiment of the present invention.

Please refer to FIG. 1, which is a cross-section view of an integrated circuit (IC) 10 according to an embodiment of the present invention. The IC 10 may be used in a driving device of a display system. For example, the IC 10 may be a driver IC. As shown in FIG. 1, the IC 10 comprises a substrate 100. The substrate 100 may be a silicon substrate and comprises areas 102 and 104. The area 102 comprises a plurality of trenches 106 and a plurality of isolations 108 and the area 104 comprises a plurality of trenches 110 and a plurality of isolations 112. The area 102 is utilized for configuring circuit components (e.g. Metal-Oxide-Semiconductor Field-Effect Transistor (MOSFET)) (not shown in FIG. 1) operating in a high-voltage range HV and the area 104 is utilized for configuring circuit components (not shown in FIG. 1) operating in a low-voltage range LV. For example, a maximum voltage of the high-voltage range HV is between 13.5 volts and 27 volts and a maximum voltage of the low-voltage range LV is between 1.2 volts and 3.3 volts. In this embodiment, a depth difference exists between each of the trenches 106 and each of the trenches 110. Since the depths of the trenches 106 are greater those of the trenches 110 (i.e. the depths of the isolations 108 are greater than those of the trenches 112), the minimum sizes of the circuit components of the high-voltage range HV and the low-voltage range LV keep the same even if the maximum voltage of the high-voltage range HV constantly increases and/or the maximum voltage of the low-voltage range LV constantly decreases. In such a condition, the size and the manufacturing cost of the integrated circuit 10 is accordingly reduced. Moreover, the probability of the dislocation occurs in the IC 10 is reduced.

In details, the isolations 108 and 112 may be shallow trench isolations (STIs) utilized for isolating the electron transmission between the circuit components in the substrate 100. Via a special manufacturing process, the depth difference between 500 angstroms and 800 angstroms exists between the trenches 106 and 110. That is, the isolations 108 have greater depth in comparison with the isolations 112, to enhance the effect of isolating electron transmission between the circuit components in the area 102 (i.e. the circuit components operating in high-voltage range HV) and between the circuit components in the area 102 and those in the area 104 (i.e. the circuit components operating in high-voltage range HV and the circuit components operating in low-voltage range LV). As a result, even if the maximum voltage of the high-voltage range HV constantly increases and/or the maximum voltage of the low-voltage range LV constantly decreases the minimum size of the circuit components (e.g. the minimum width of the gate of the transistor) in the areas 102 and 104 can be constantly decreased with the process advances without affecting by the voltage range alternations. The size and the manufacturing cost of the IC 10 are accordingly decreased. Further, the probability of the dislocation occurs in the IC 10 is decreased via deepening the depths of the isolations 108.

Figure 2A:
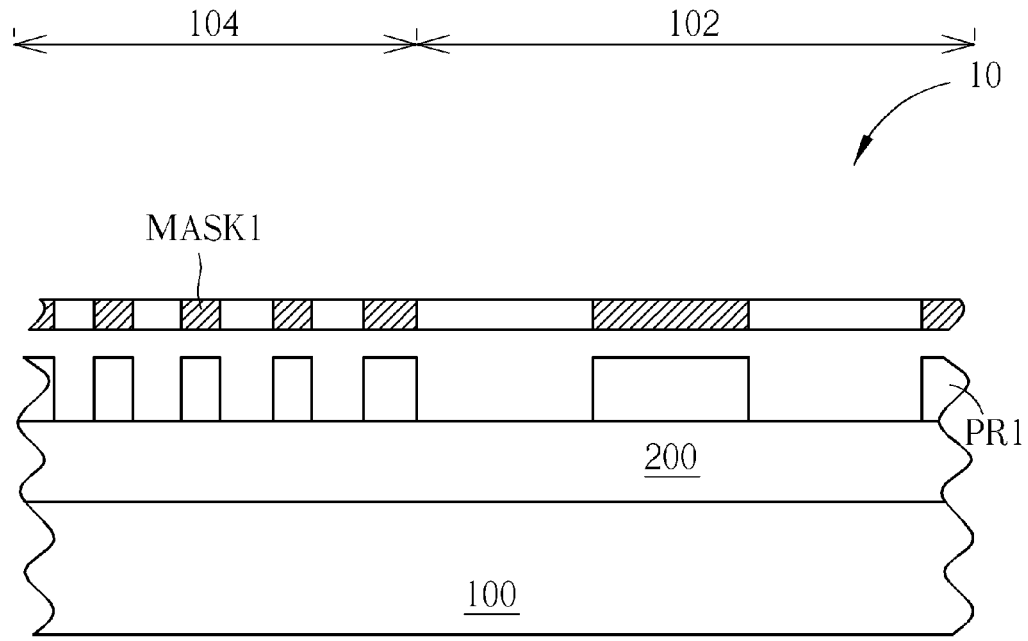
FIGS. 2A-2I are cross-section views of the integrated circuit shown in FIG. 1 during the manufacturing process.
Figure 2B:
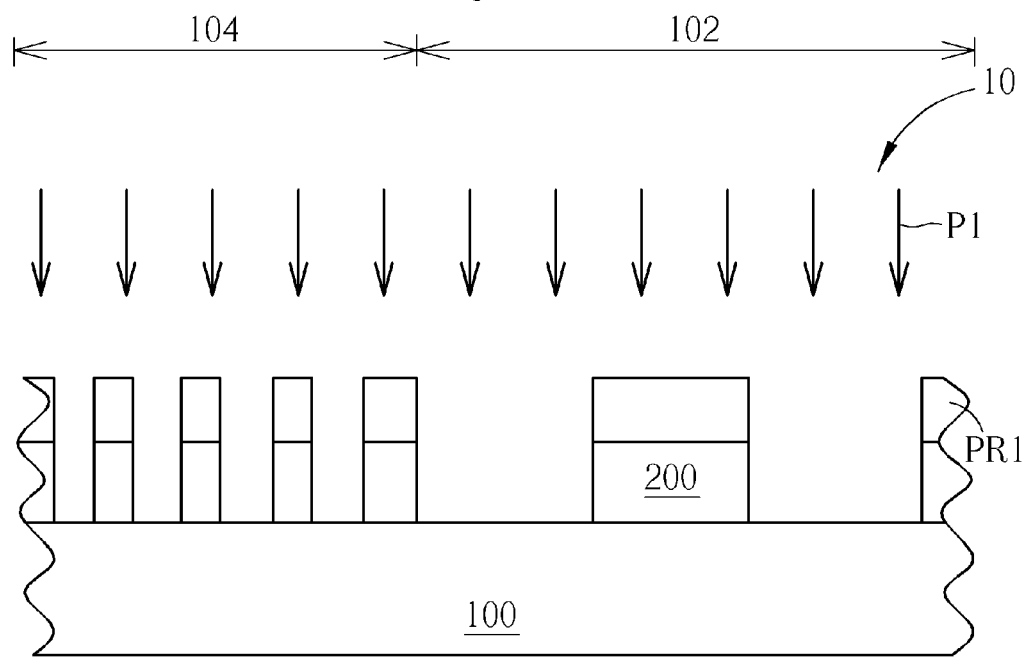
Figure 2C:
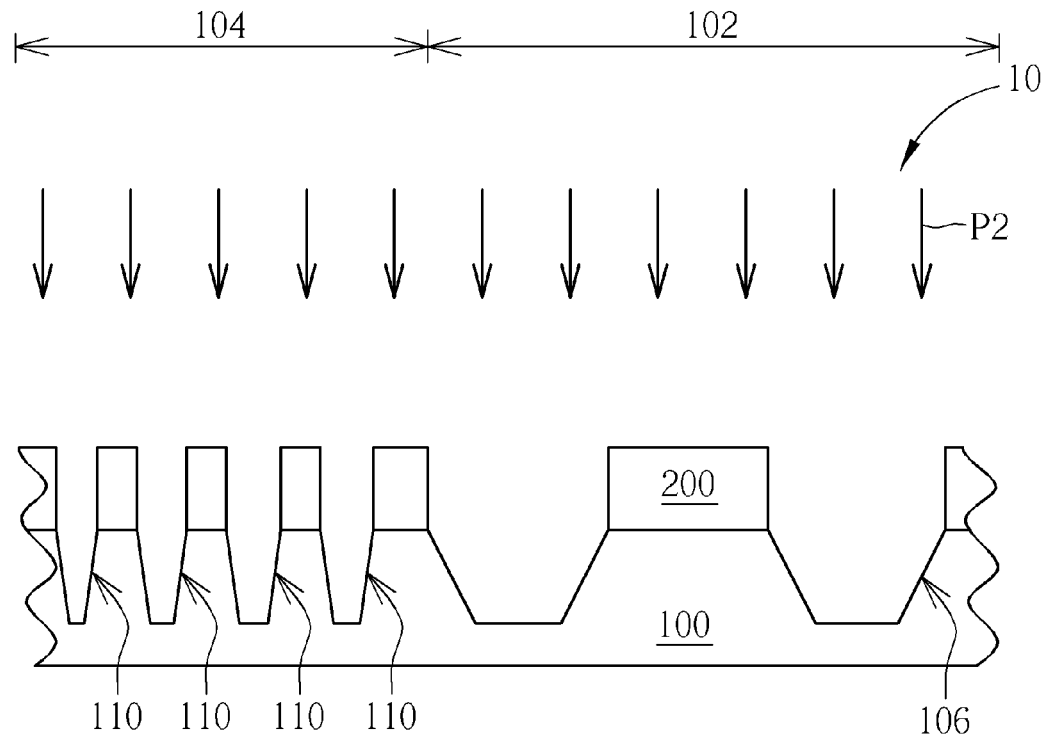

Please refer to FIGS. 2A-2I, which are cross-section views of the IC 10 shown in FIG. 1 during a manufacturing process. In FIG. 2A, a shielding layer 200 (e.g. a $Si_3N_4$ layer) and a photo resistor layer PR1 are formed (e.g. deposited or coated) on the substrate 100 from bottom to top. Via a mask MASK1, parts of the photo resistor layer PR1 are removed and the photo resistor layer PR1 forms a specific pattern. In FIG. 2B, an etching process P1 (e.g. a dry etch) is performed, to make the shielding layer 200 to form the specific pattern. Next, the plurality of trenches 106 is formed in the area 102 and the plurality of trenches 110 is formed in the area 104 via performing an etching process P2 (e.g. a trench etch), as shown in FIG. 2C.

Figure 2D:
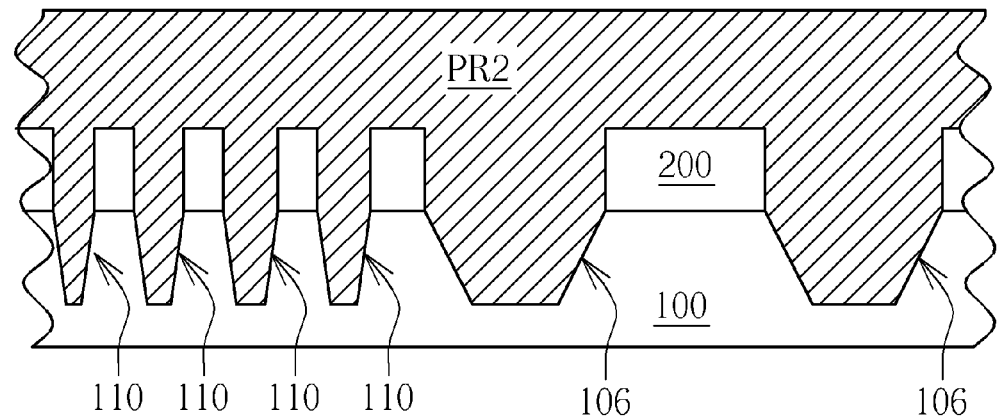
Figure 2E:
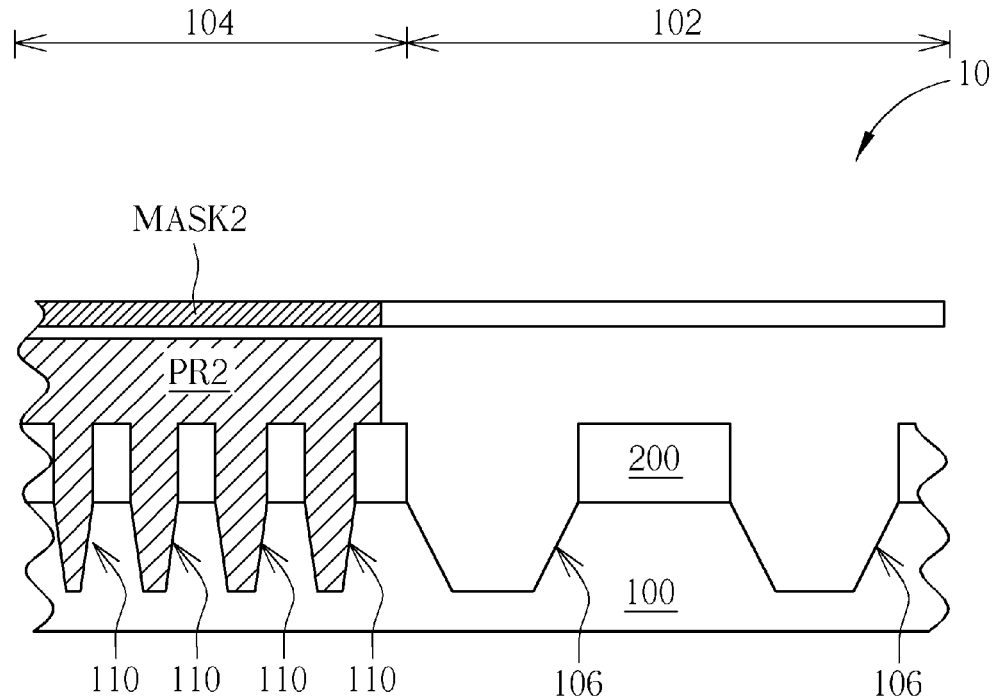
Figure 2F:
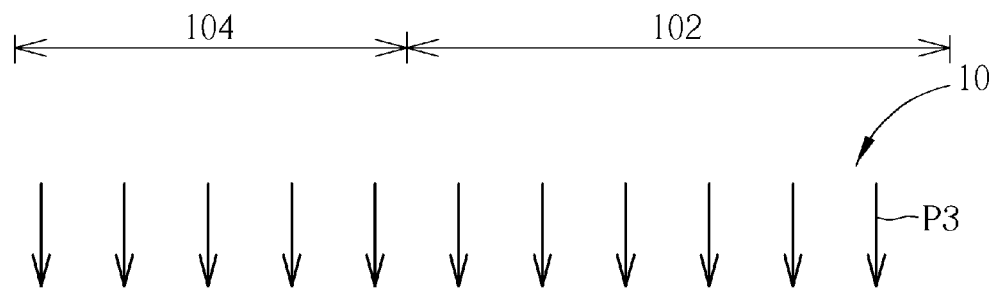
Figure 2F:
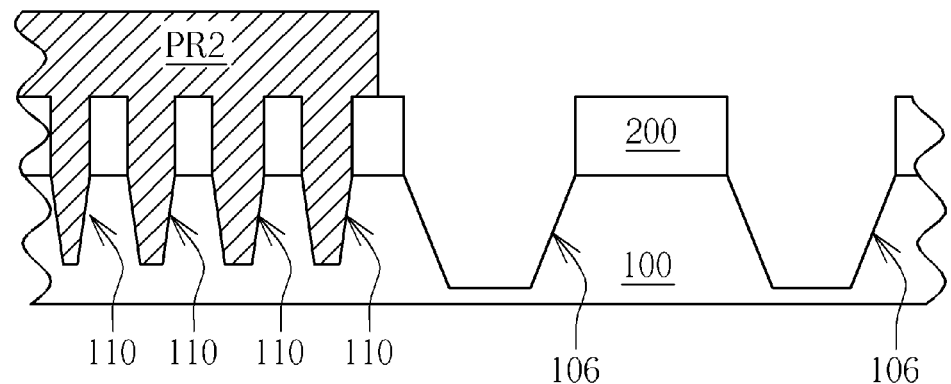

Please refer to FIGS. 2D-2F. In order to deepen the depths of the trenches 106, a photo resistor layer PR2 is formed (e.g. coated) on the substrate 100. After removing the photo resistor layer PR2 covered on the area 102 via a mask MASK2, an etching process P3 (e.g. a dry etch) is performed to deepen the depths of the trenches 106. Since the trenches 106 undergo 2 etching processes, the depths of the trenches 106 are greater than those of the trenches 110. Note that, the depth difference between the trenches 106 and 110 is between 500-8000 angstroms via controlling the time of the etching process P3.

Figure 2G:
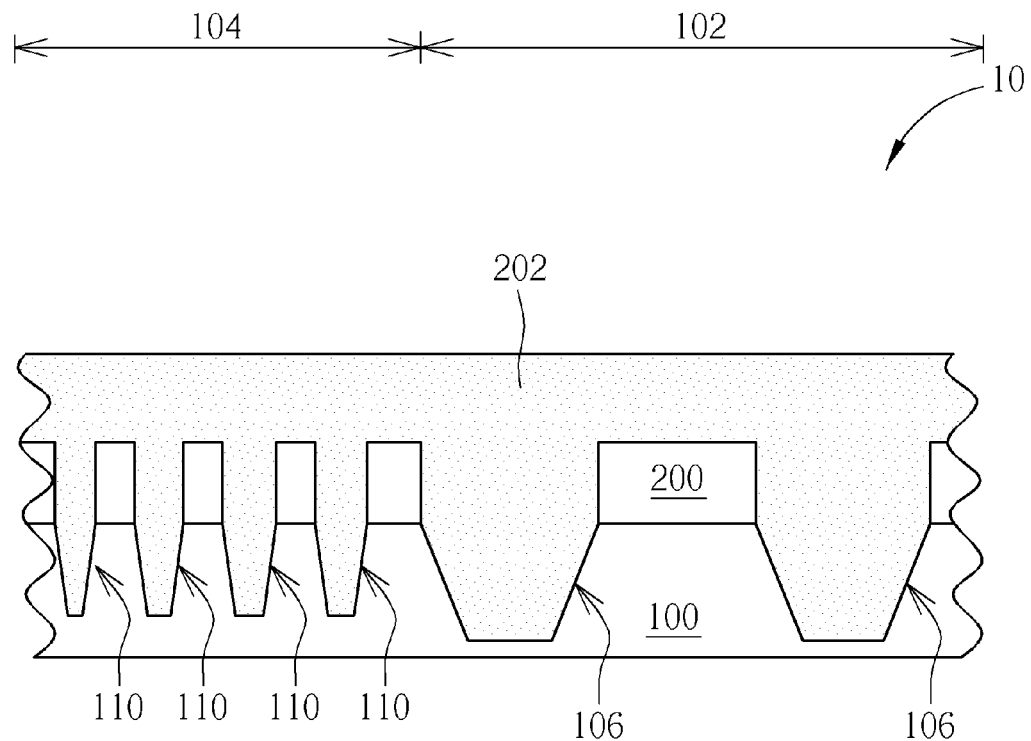
Figure 2H:
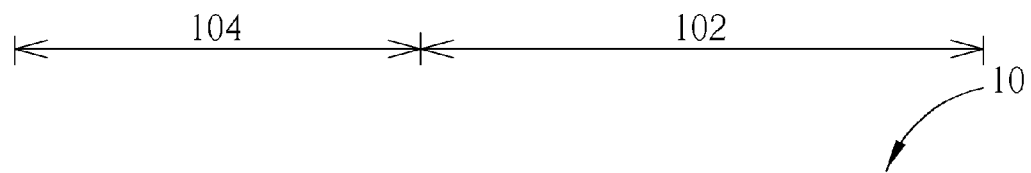
Figure 2H:
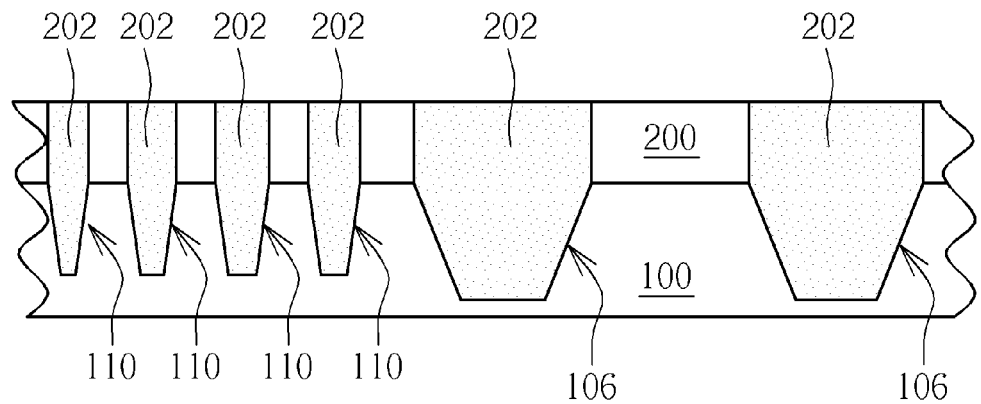
Figure 2I:
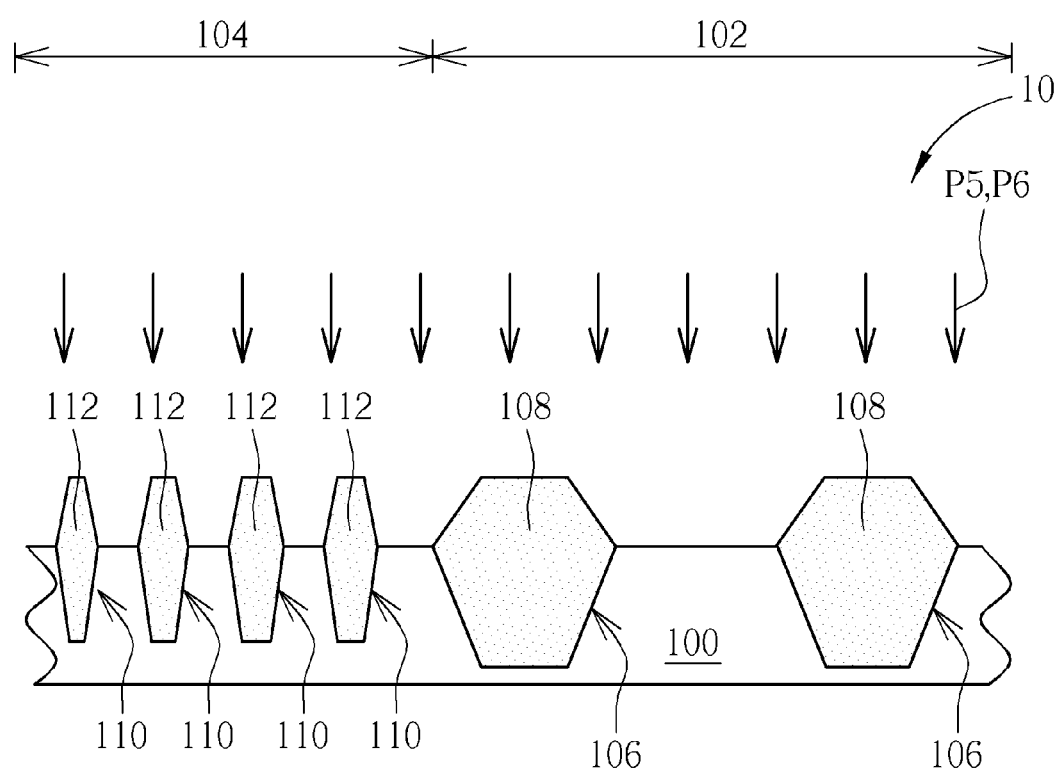

Please refer to FIGS. 2G-2I. In order to form the isolations 108 and 112 in the trenches 106 and 110, respectively, an isolation material (e.g. high density plasma oxide) is filled on the substrate 100, to form an isolation layer 202. Next, a planarization process P4 (e.g. a chemical-mechanical planarization (CMP) process) is performed, to make a height of the isolation layer 202 to be equal to that of the shielding layer 200. After performing an etching process P5 on the isolation layer 202, the isolations 108 and 112 are formed in the trenches 106 and 112, respectively. Finally, an etching process P6 is performed to remove the shielding layer 200 and to acquire the IC 10 shown in FIG. 1.

Figure 3:
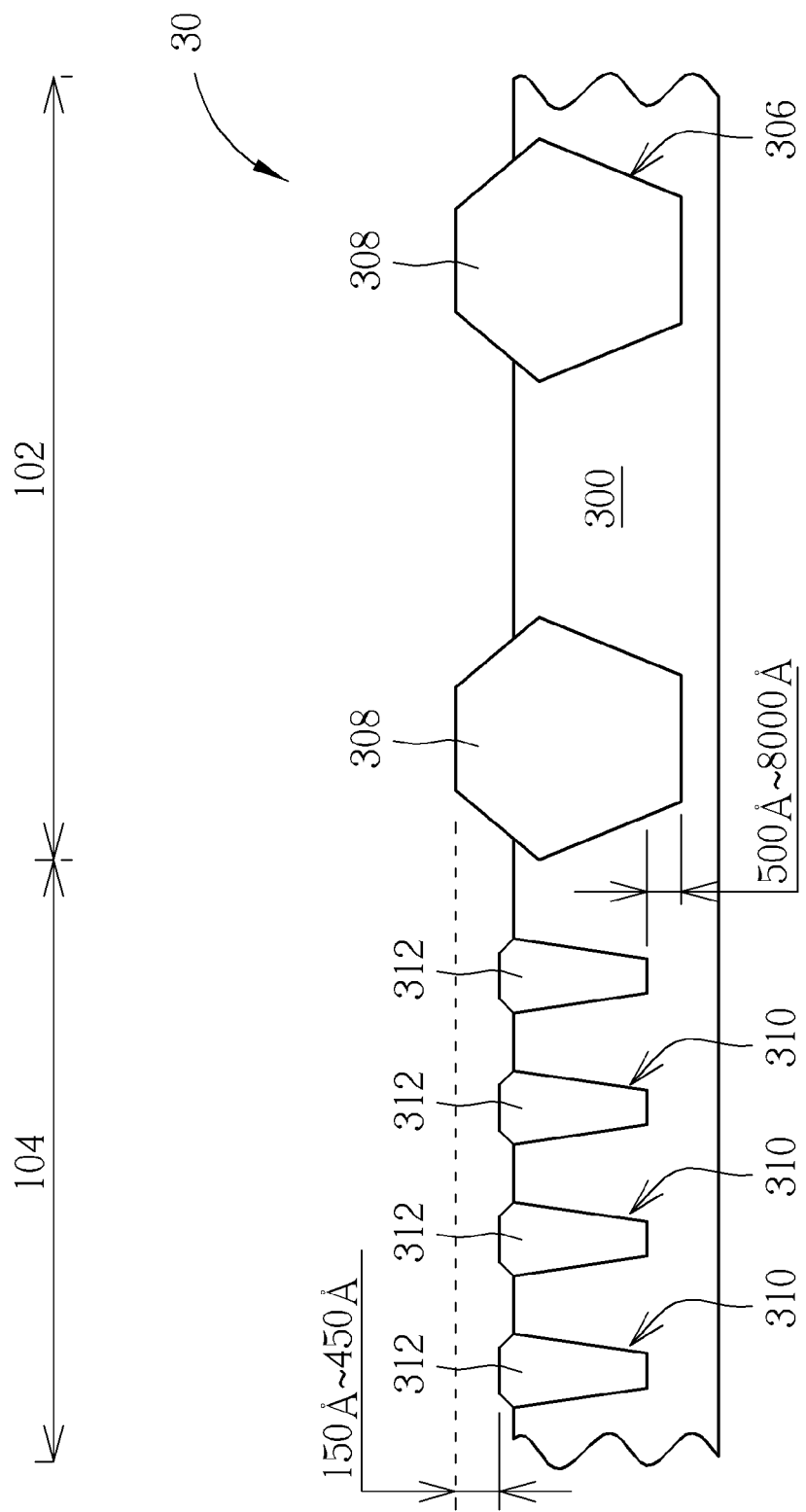
FIG. 3 is a cross-section view of another integrated circuit according to an embodiment of the present invention.
Figure 4A:
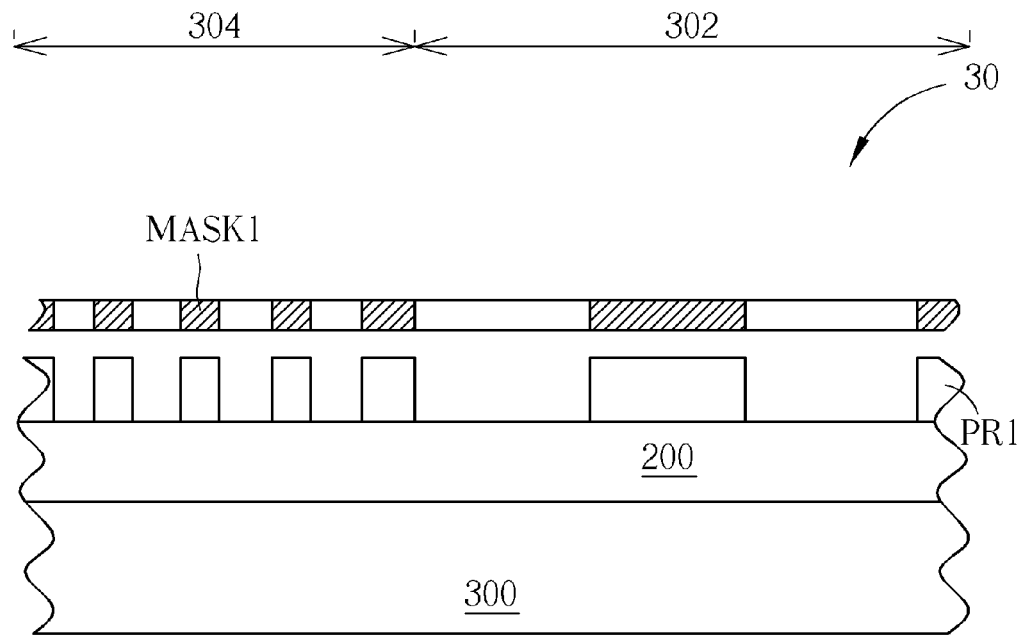
FIGS. 4A-4L are cross-section views of the integrated circuit shown in FIG. 3 during the manufacturing process.
Figure 4B:
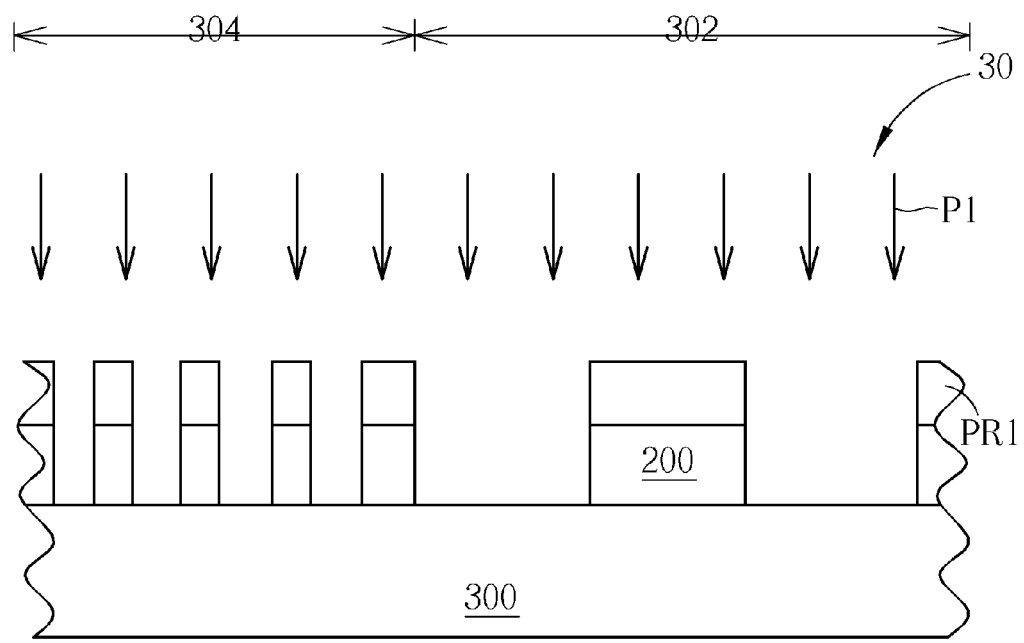
Figure 4C:
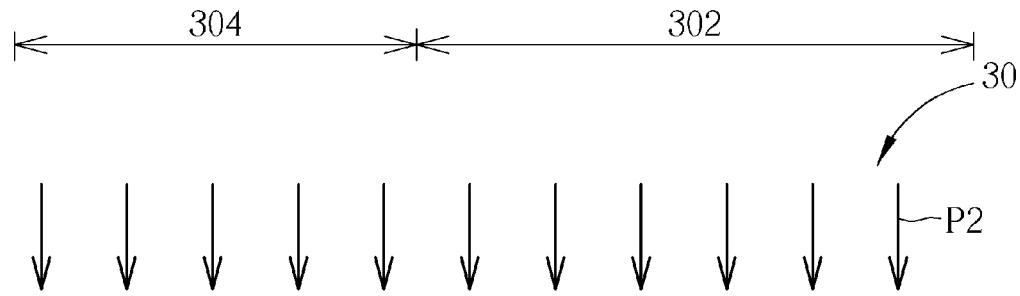
Figure 4C:
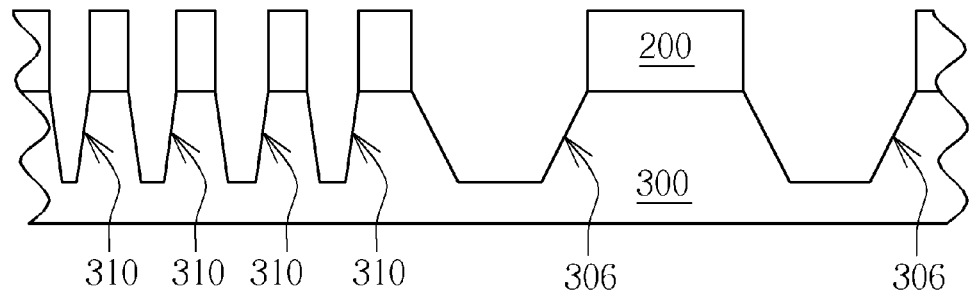
Figure 4D:
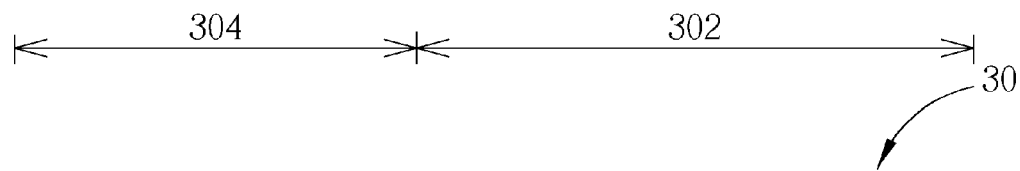
Figure 4D:
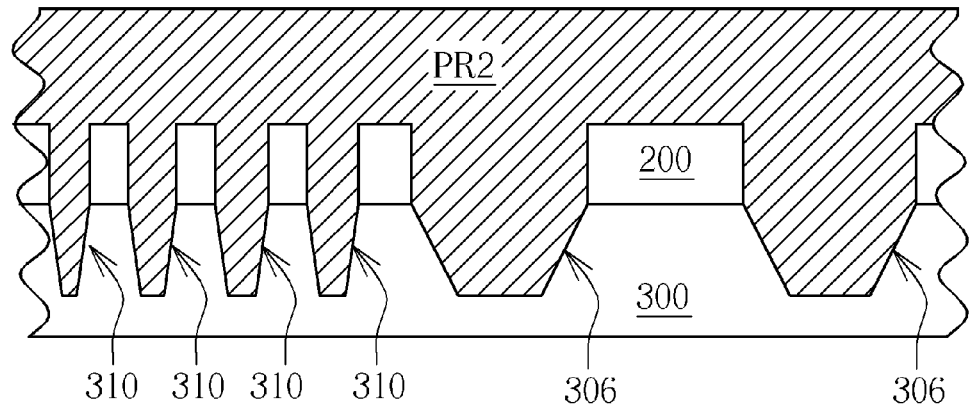
Figure 4E:
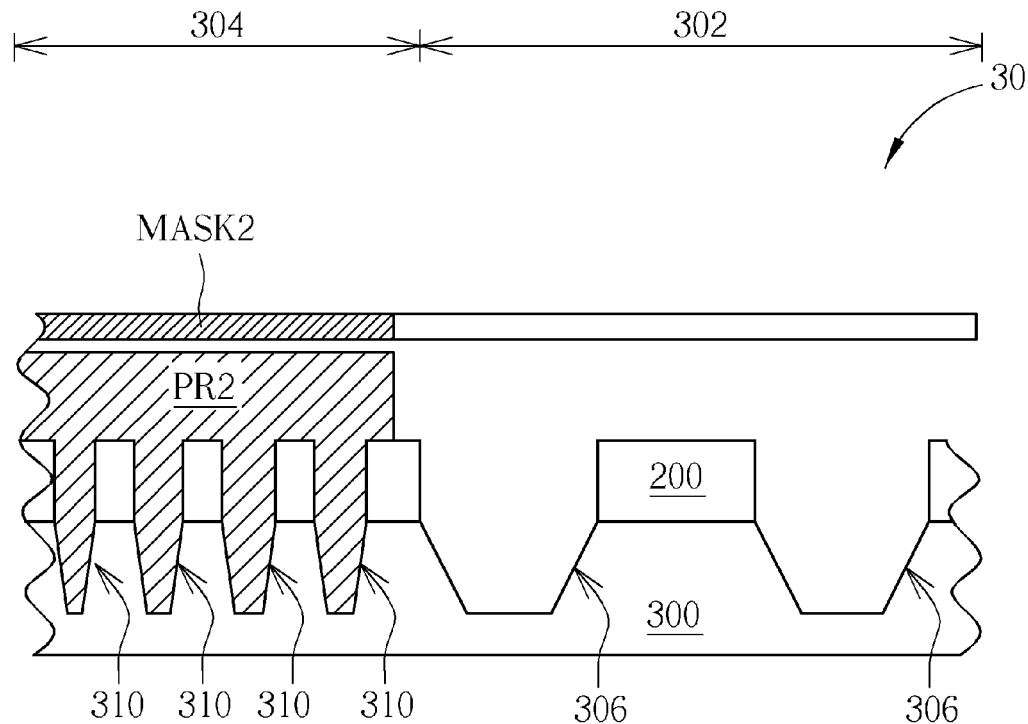
Figure 4F:
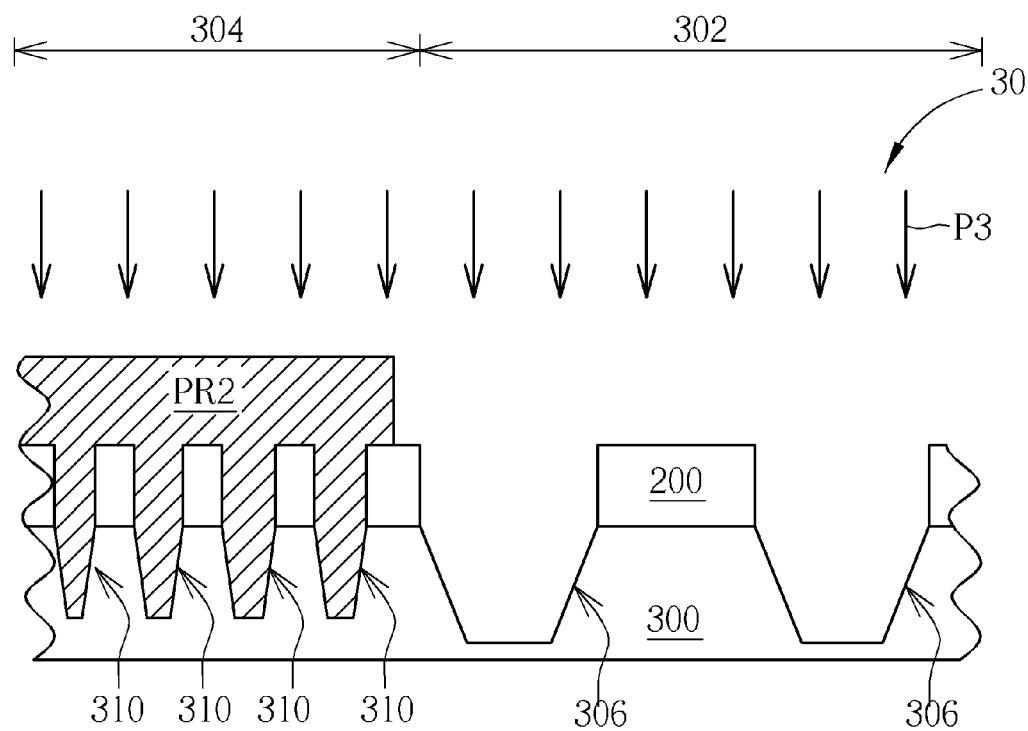
Figure 4G:
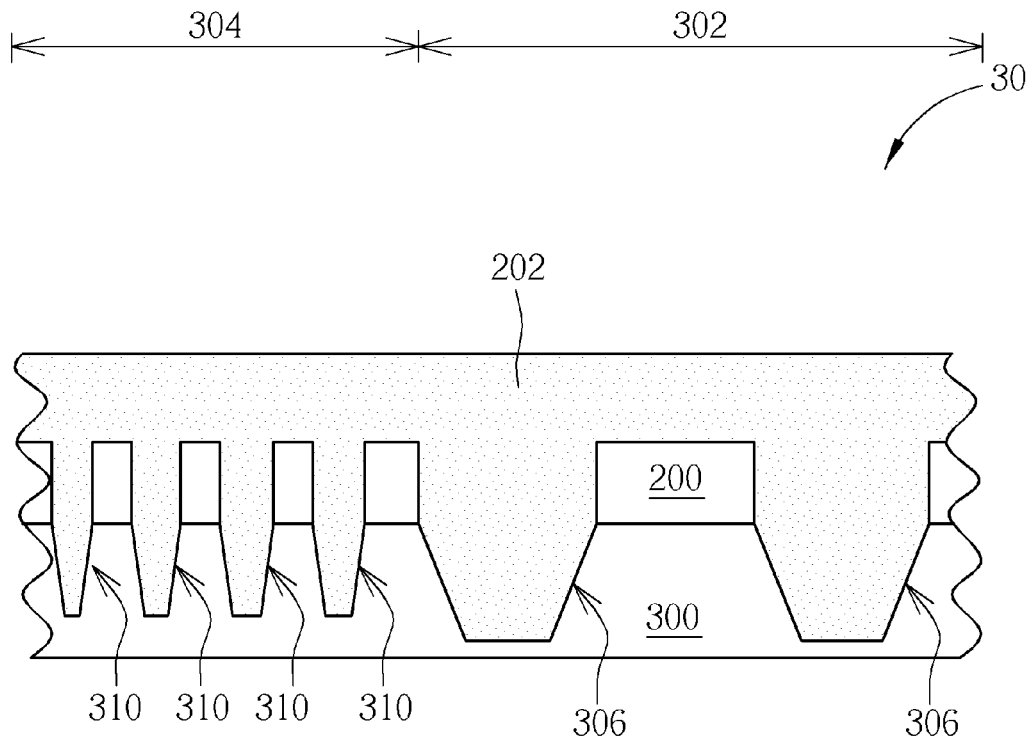
Figure 4H:
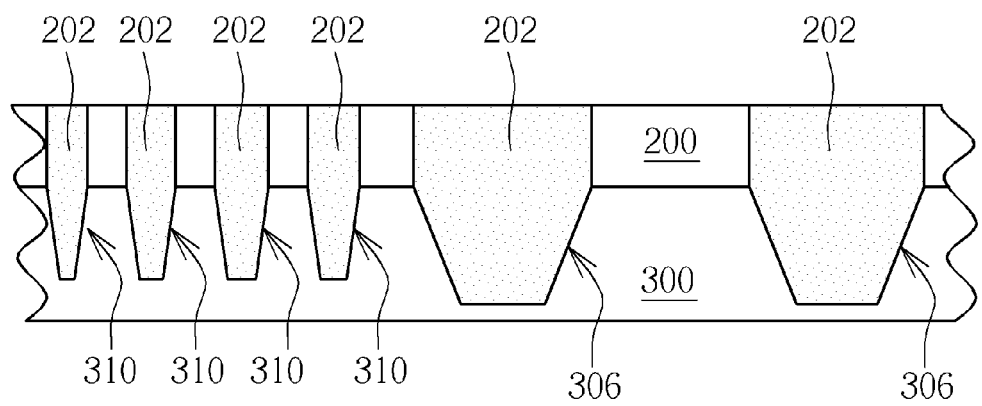
Figure 4I:
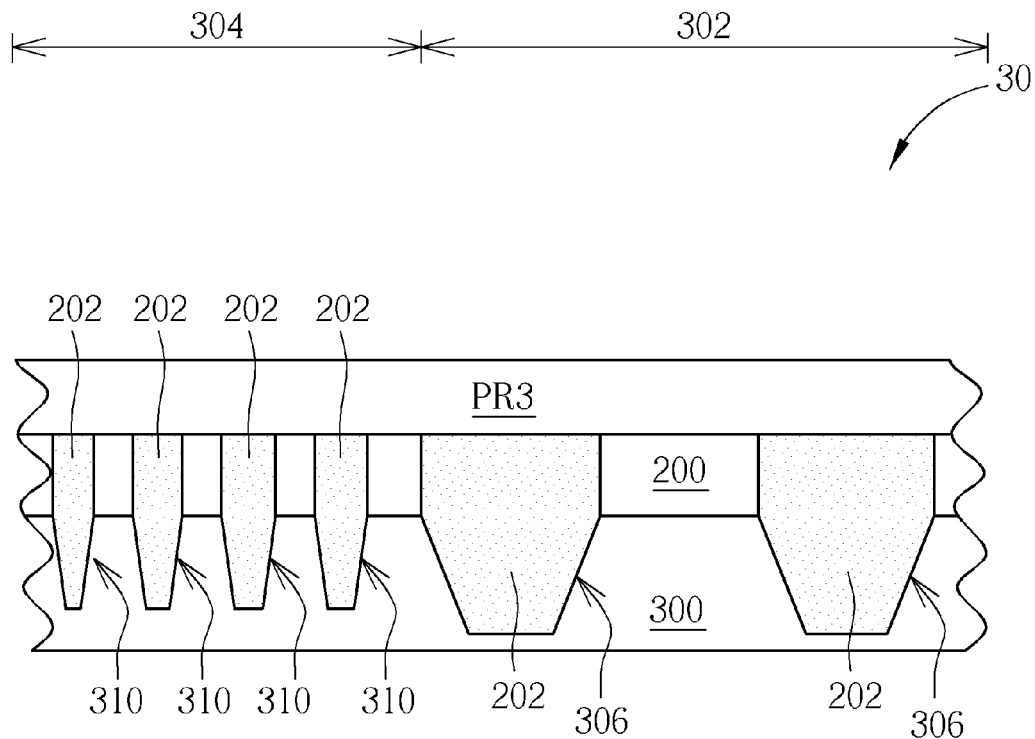
Figure 4J:
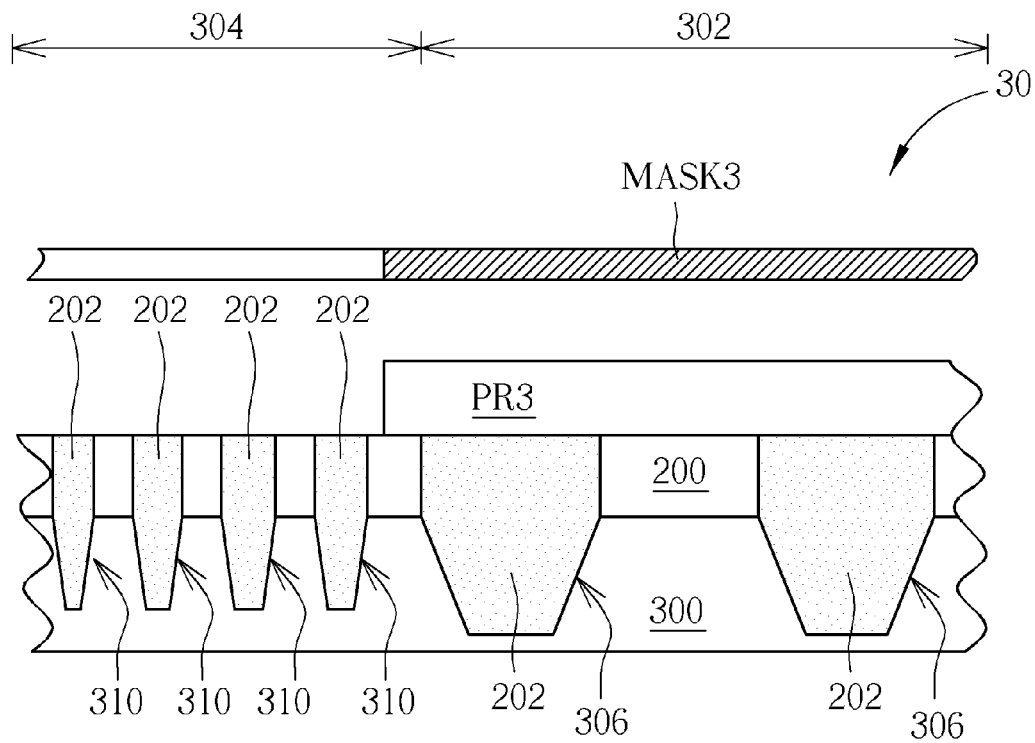
Figure 4K:
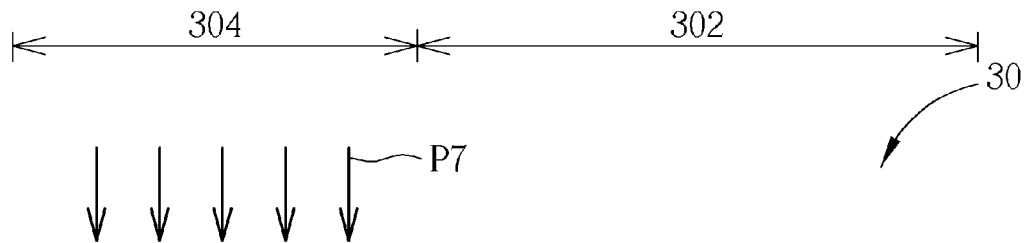
Figure 4L:
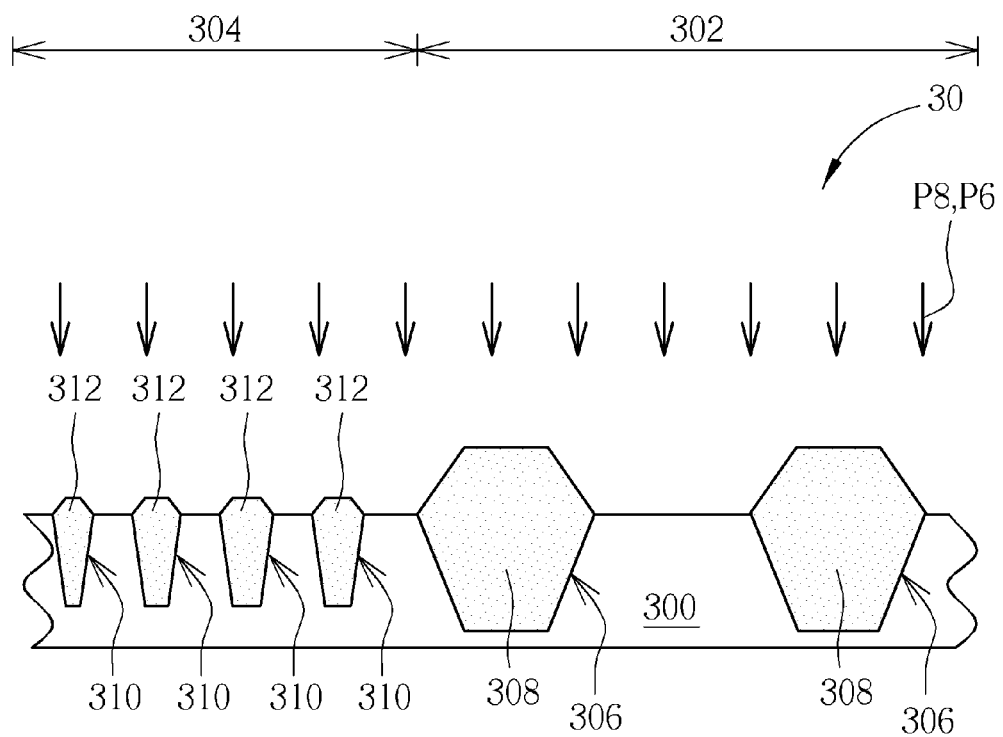

Please refer to FIG. 3, which is a cross-section view of an IC 30 according to an embodiment of the present invention. The IC 30 may be used in a driving device of the display system. For example, the IC 30 may be a driver IC. Similar to the IC 10 shown in FIG. 1, the IC 30 comprises a substrate 300. The substrate 300 may be a silicon substrate and comprises areas 302 and 304. The area 302 comprises a plurality of trenches 306 and a plurality of isolations 308 and the area 304 comprises a plurality of trenches 310 and a plurality of isolations 312. The area 302 is utilized for configuring the circuit components (not shown in FIG. 3) operating in the high-voltage range HV and the area 304 is utilized for configuring the circuit components (not shown in FIG. 3) operating in the low-voltage range LV. In comparison with the IC 10, there is not only the depth difference but also a height difference between the isolations 308 and 312, to further enhance the effect of isolating electron transmission between the circuit components in the area 302 and between the circuit components in the areas 302 and 304. As a result, even if the maximum voltage of the high-voltage range HV constantly increases and/or the maximum voltage of the low-voltage range LV constantly decreases, the minimum size of the circuit components in the areas 302 and 304 can be constantly decreased with the process advances and without affecting by the voltage range alternations. The size and the manufacturing cost of the IC 30 are accordingly decreased. Further, the probability of the dislocation occurs in the IC 30 is also decreased via deepening the depths of the isolations 108.

Please refer to FIGS. 4A-4L, which are cross-section views of the IC 30 shown in FIG. 3 during a manufacturing process. The manufacturing procedures in FIGS. 4A-4H can be referred to those in FIGS. 2A-2H, and are not narrated herein for brevity.

Please refer to FIGS. 4I-4L. In order to make the isolations 308 and 312 to equip different heights, a photo resistor layer PR3 is formed (e.g. coated) on the substrate 300. The photo resistor layer PR3 covered on the area 304 is removed via a mask MASK3. Next, an etching process P7 (e.g. a dry etch) is performed, to etch the isolation layer 202 in the area 304. After the photo resistor layer PR3 is totally removed, an etching process P8 (e.g. a dry etch) is performed to simultaneously etch the isolation layer 202 in the area 302 and 304. Since the isolation layer 202 in the area 304 undergoes 2 times of etching process and the isolation layer 202 in the area 302 only undergoes a time of etching process, there would be the height difference between the isolations 308 and 312. Via adjusting the etching process P7 performed in FIG. 4K, the height difference between the isolations 308 and 312 may be between 150 angstroms and 450 angstroms. Finally, the shielding layer 200 is removed via performing the etching process P6 and the IC 30 shown in FIG. 3 can be acquired.

According to different applications and design concepts, those with ordinary skill in the art may observe appropriate alternations and modifications. For example, the isolations operating in the same voltage range equip the same height and the isolations operating in different voltage ranges may equip the same depth and different heights.

Figure 5:
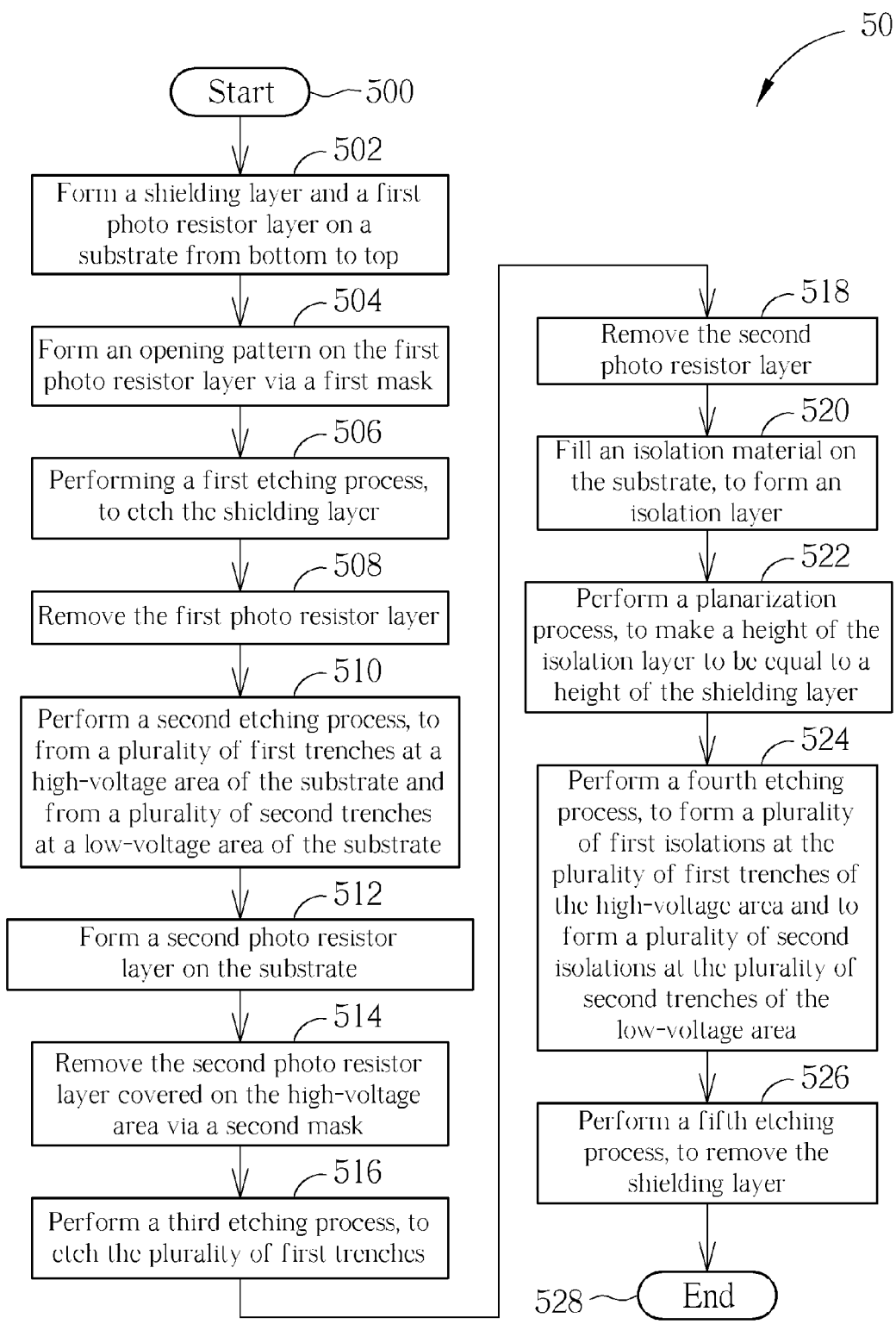
FIG. 5 is a flowchart of a process according to an embodiment of the present invention.

The process of the above embodiments manufactures the IC 10 can be summarized into a process 50, as shown in FIG. 5. The process 50 is utilized for manufacturing a driving device in the display system, and comprises the following steps:

Step 500: Start.

Step 502: Form a shielding layer and a first photo resistor layer on a substrate from bottom to top.

Step 504: Form an opening pattern on the first photo resistor layer via a first mask.

Step 506: Performing a first etching process, to etch the shielding layer.

Step 508: Remove the first photo resistor layer.

Step 510: Perform a second etching process, to from a plurality of first trenches at a high-voltage area of the substrate and from a plurality of second trenches at a low-voltage area of the substrate.

Step 512: Forma second photo resistor layer on the substrate.

Step 514: Remove the second photo resistor layer covered on the high-voltage area via a second mask.

Step 516: Perform a third etching process, to etch the plurality of first trenches.

Step 518: Remove the second photo resistor layer.

Step 520: Fill an isolation material on the substrate, to form an isolation layer.

Step 522: Perform a planarization process, to make a height of the isolation layer to be equal to a height of the shielding layer.

Step 524: Perform a fourth etching process, to form a plurality of first isolations at the plurality of first trenches of the high-voltage area and to form a plurality of second isolations at the plurality of second trenches of the low-voltage area.

Step 526: Perform a fifth etching process, to remove the shielding layer.

Step 528: End.

According to the process 50, the isolations for different voltage ranges equip different depths, to allow the minimum size of the circuit components of different voltage ranges to be constantly shrunk with the process advances and without affecting by the alternations of the voltage range. Furthermore, the probability of the dislocation occurs in the IC is also decreased. The detail operations of the process 50 can be referred to the above and are not described herein for brevity.

Figure 6:
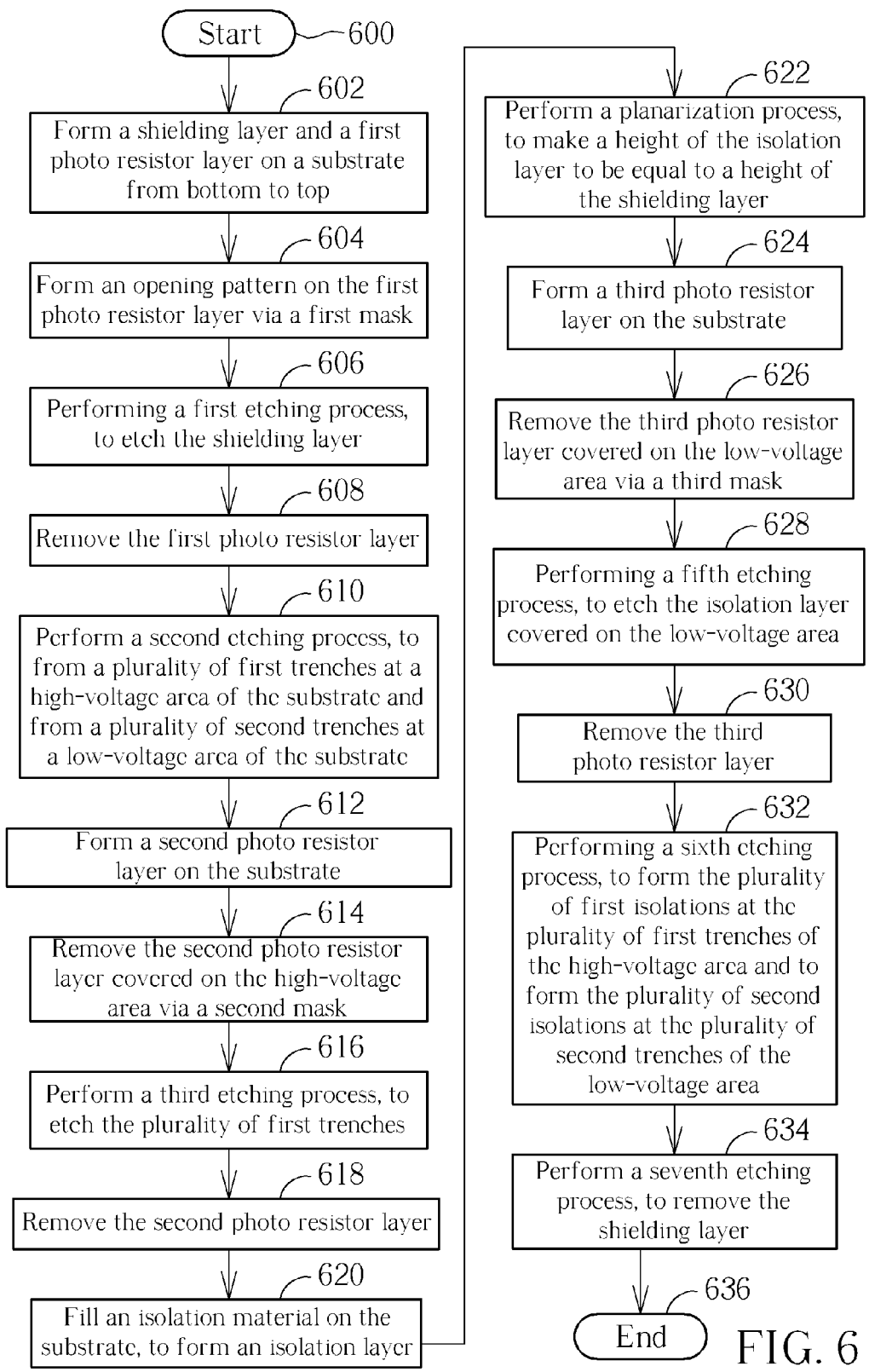
FIG. 6 is a flowchart of another process according to an embodiment of the present invention.

The process of manufacturing the IC 30 in the above embodiments can be summarized into a process 60 shown in FIG. 6. The process 60 is utilized for manufacturing a driving device of the display device and comprises the following steps:

Step 600: Start.

Step 602: Form a shielding layer and a first photo resistor layer on a substrate from bottom to top.

Step 604: Form an opening pattern on the first photo resistor layer via a first mask.

Step 606: Performing a first etching process, to etch the shielding layer.

Step 608: Remove the first photo resistor layer.

Step 610: Perform a second etching process, to from a plurality of first trenches at a high-voltage area of the substrate and from a plurality of second trenches at a low-voltage area of the substrate.

Step 612: Form a second photo resistor layer on the substrate.

Step 614: Remove the second photo resistor layer covered on the high-voltage area via a second mask.

Step 616: Perform a third etching process, to etch the plurality of first trenches.

Step 618: Remove the second photo resistor layer.

Step 620: Fill an isolation material on the substrate, to form an isolation layer.

Step 622: Perform a planarization process, to make a height of the isolation layer to be equal to a height of the shielding layer.

Step 624: Form a third photo resistor layer on the substrate.

Step 626: Remove the third photo resistor layer covered on the low-voltage area via a third mask.

Step 628: Performing a fifth etching process, to etch the isolation layer covered on the low-voltage area.

Step 630: Remove the third photo resistor layer.

Step 632: Performing a sixth etching process, to form the plurality of first isolations at the plurality of first trenches of the high-voltage area and to form the plurality of second isolations at the plurality of second trenches of the low-voltage area.

Step 634: Perform a seventh etching process, to remove the shielding layer.

Step 636: End.

According to the process 60, the isolations for different voltage ranges equip different depths and different heights, to allow the minimum size of the circuit components of different voltage ranges to be constantly shrunk with the process advances and without affecting by the alternations of the voltage range. Furthermore, the probability of the dislocation occurs in the IC is also decreased. The detail operations of the process 50 can be referred to the above and are not described herein for brevity.

To sum up, the isolations for different voltage ranges equip different depth and/or different heights in the IC of the above embodiments. Accordingly, the circuit components for different voltage ranges can be constantly shrunk with the process advances and without affecting by the alternations of the voltage range. Moreover, the isolations with different depths also can lower the probability of the dislocation occurs in the IC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit for a driving device, the integrate circuit comprising:
    a substrate comprising a high-voltage area and a low-voltage area;
    a plurality of first trenches, formed in the high-voltage area;
    a plurality of first isolations, formed in the plurality of first trenches of the high-voltage area;
    a plurality of second trenches, formed in the low-voltage area; and
    a plurality of second isolations, formed in the plurality of second trenches of the low-voltage area;
    wherein a depth difference exists between each of the plurality of first trenches and each of the plurality of second trenches;
    wherein each of the plurality of first isolations is a first height higher than a surface of the substrate, each of the plurality of second isolations is a second height higher than the surface of the substrate, and the first height and the second height are different.

2. The integrated circuit of claim 1, wherein the plurality of first isolations and the plurality of second isolations are shallow trench isolations (STIs).

3. The integrated circuit of claim 1, wherein the depth difference is between 500 angstroms and 8000 angstroms.

4. The integrated circuit of claim 1, wherein a difference between the first height and the second height is between 150 angstroms and 450 angstroms.

5. The integrated circuit of claim 1, wherein the high-voltage area comprises a plurality of circuit components operating in a high-voltage range, the low-voltage area comprises a plurality of circuit components operating in a low-voltage range, a maximum voltage of the high-voltage range is between 13.5 volts and 27 volt, and a maximum voltage of the low-voltage range is between 1.2 volts and 3.3 volts.

* * * * *